United States Patent [19]

Ma

[11] Patent Number: 5,281,862
[45] Date of Patent: Jan. 25, 1994

[54] POWER MOSFET DRIVER WITH CROSS-CONDUCTION CURRENT REDUCTION

[75] Inventor: Bing F. Ma, Sunnyvale, Calif.

[73] Assignee: Micro Linear Corporation, San Jose, Calif.

[21] Appl. No.: 960,246

[22] Filed: Oct. 13, 1992

Related U.S. Application Data

[63] Continuation of Ser. No. 727,483, Jul. 9, 1991, abandoned.

[51] Int. Cl.$^5$ .................. H03K 17/60; H03K 5/12
[52] U.S. Cl. ............................ 307/270; 307/263; 307/570; 307/254; 307/456; 307/300
[58] Field of Search ............... 307/270, 263, 570–572, 307/254, 300, 456

[56] References Cited

U.S. PATENT DOCUMENTS

| | | | |
|---|---|---|---|
| 4,081,695 | 3/1978 | Allen et al. | 307/300 |
| 4,423,341 | 12/1983 | Shelly | 307/570 |
| 4,507,575 | 3/1985 | Mori et al. | 307/456 |
| 5,034,631 | 7/1991 | Mouret | 307/300 |

FOREIGN PATENT DOCUMENTS

| | | | |
|---|---|---|---|
| 0344614 | 12/1989 | European Pat. Off. | 307/456 |
| 0057821 | 3/1989 | Japan | 307/456 |
| 0114116 | 5/1989 | Japan | 307/456 |

*Primary Examiner*—Margaret R. Wambach
*Attorney, Agent, or Firm*—Haverstock, Medlen & Carroll

[57] ABSTRACT

An output circuit includes a totem-pole output circuit for driving a power MOSFET. A pull-up circuit and a pull-down circuit drive the output node low or high as required. The circuit prevents the pull-up and pull-down circuits from simultaneously conducting current. The pull-up circuit has a pull-up threshold voltage and the pull-down circuit has a pull-down threshold voltage such that the pull-up circuit is turned off before the pull-down circuit is activated when the output node is switched from a high state to a low state and further wherein the pull-down circuit is turned off before the pull-up circuit is activated when the output node switches from a low state to a high state. The pull-up circuit is held off when the output node is switched from a high state to a low state by two diodes from the output node to an input of the pull-up circuit. The diodes are connected in series, one diode having its anode coupled to the output node and the cathode of the other diode coupled to the input of pull-up circuit. The pull-down circuit is cut off before the pull-up Darlington drives the output from low to high by having the pull-down threshold higher than the pull-up threshold. A resistor connected between the base of the controlling transistor for the pull-up Darlington and the ground shortens the output low-to-high propagation delay time and the output rise time by shunting transient parasitic capacitance current of the pull-up controlling transistor to the ground.

17 Claims, 1 Drawing Sheet

POWER MOSFET DRIVER WITH CROSS-CONDUCTION CURRENT REDUCTION

This is a file wrapper continuation of copending application Ser. No. 07/727,483 filed on Jul. 9, 1991.

FIELD OF THE INVENTION

This invention relates to an integrated power MOSFET driver with cross-conduction current reduction.

BACKGROUND OF THE INVENTION

In conventional bipolar totem-pole drivers for power MOSFET's it is possible for both the pull-up and pull-down circuits to conduct at the same time during transients. Spikes of current flow from the positive supply to the ground, resulting in excessive power losses at high switching frequencies. The switching transient spikes can also deleteriously affect the operation of other sensitive circuits.

The circuit described in this patent eliminates transient cross-conduction current by preventing the pull-up and pull-down circuits from conducting simultaneously. Other design considerations for the circuit described include reduced switching time and means of producing temperature independent, non-overlapped conduction intervals for cross-conduction elimination.

SUMMARY OF THE INVENTION

An output circuit in accordance with the present invention includes a totem-pole output circuit for driving a power MOSFET. A pull-up circuit and a pull-down circuit drive the output node low or high as required. During normal dc operation only one of the pull-up or pull-down circuits is turned on. When the pull-up is on and the pull-down is off the output node is high. When the pull-down is on and the pull-up is off the output node is low.

Since the output circuit is intended for driving MOSFET's, the totem-pole transistors carry no dc current. If both the pull-up and pull-down transistors are on at the same time, excessive power will be lost, especially at high frequencies. A circuit built according to the present invention prevents the pull-up and pull-down circuits from conducting simultaneously.

The pull-up circuit has a pull-up threshold voltage and the pull-down circuit has a pull-down threshold voltage. The pull-up circuit is turned off before the pull-down circuit is turned on during output high-to-low transition. The pull-down circuit is turned off before the pull-up circuit is turned on during output low-to-high transition. The pull-up circuit is held off during output high-to-low transition by having a pull-up threshold lower than the pull-down threshold. One or more conducting diodes coupled in series, one diode having its anode coupled to the output node and the cathode of the other diode coupled to the input of pull-up circuit, hold the pull-up Darlington off.

Since the threshold of the pull-down circuit is higher than that of pull-up circuit, the pull-down circuit is cut off before the pull-up circuit drives the output from a low to a high state. A resistor is used to speed up output low-to-high transition.

DETAILED DESCRIPTION OF THE PREFERRED EMBODIMENT

Figure 1:
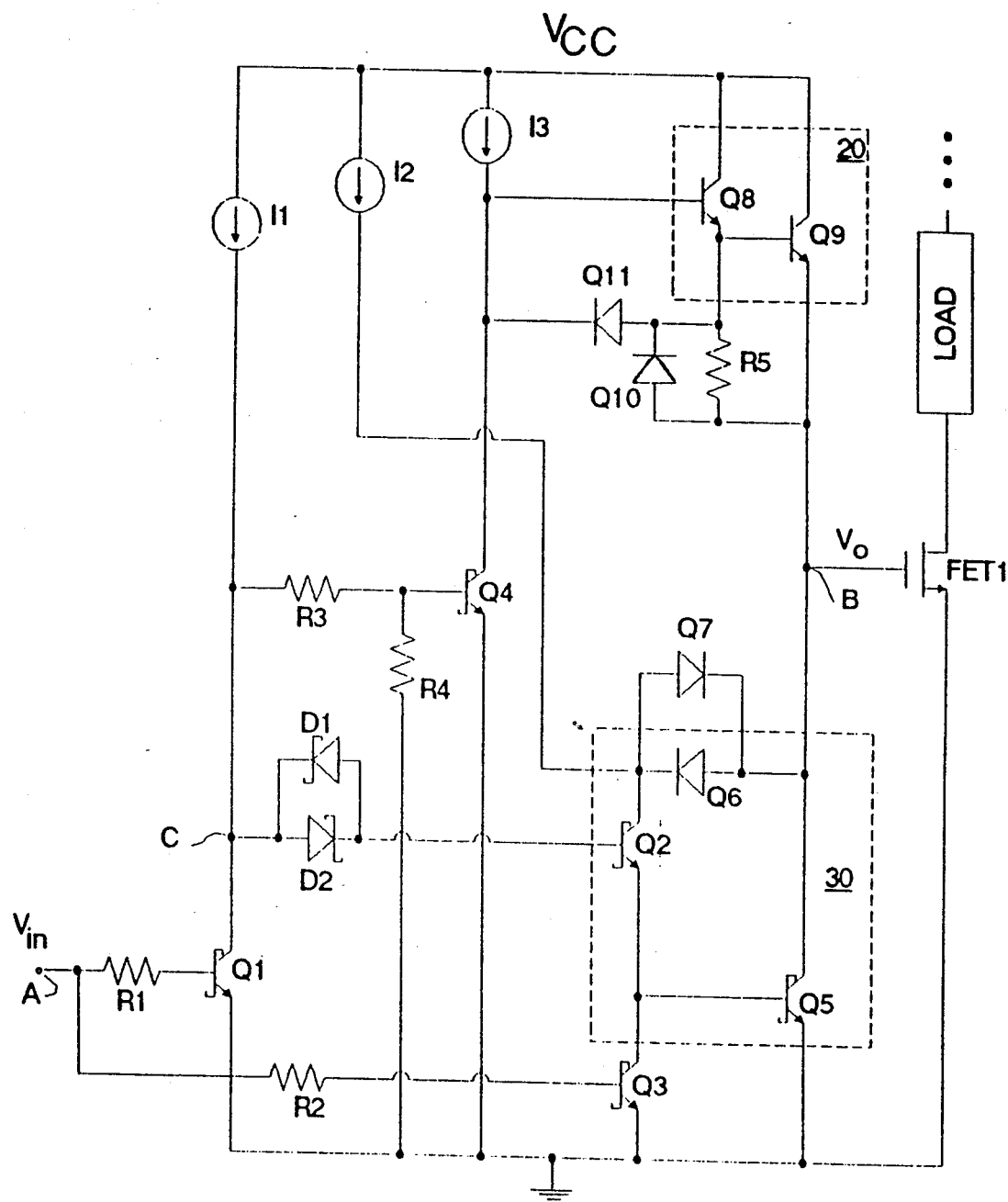
FIG. 1 shows a circuit schematic according to the preferred embodiment of the present invention.

FIG. 1 shows a schematic diagram of a circuit implementation for the preferred embodiment of the present invention. The circuit includes a power supply node $V_{cc}$, a circuit ground, an input node A and an output node B having an output voltage $V_o$. An input voltage $V_{in}$ is coupled to the input node A. The output node B drives the gate of an n-channel MOSFET transistor FET1. The drain of the MOSFET transistor FET1 is connected to a load circuit and the source to ground. The input A is coupled to two resistors R1 and R2. The other terminal of the resistor R1 is coupled to the base of a Schottky NPN bipolar transistor Q1. The emitter of transistor Q1 is coupled to ground. The collector of transistor Q1 is coupled to a first terminal of resistor R3, to the cathode of Schottky diode $D_1$, the anode of Schottky diode $D_2$ and to a current source $I_1$. The current source $I_1$ is designed to provide a $V_{BE}$ dependent current. The current source $I_1$ is also coupled to the voltage supply $V_{cc}$.

The other terminal of the resistor R2 is coupled to the base of a Schottky NPN transistor Q3. The emitter of transistor Q3 is coupled to ground. The collector of transistor Q3 is coupled to the emitter of Schottky NPN transistor Q2 and to the base of a Schottky-clamped output NPN transistor Q5. The base of transistor Q2 is coupled to the cathode of of Schottky diode $D_2$ and the anode of Schottky diode $D_1$.

The collector of transistor Q2 is coupled to the anode of a diode Q7, the cathode of a diode Q6 and to a conventional current source $I_2$. The diodes Q6 and Q7 are typically formed of the base-emitter junction of a transistor whose collector is shorted to the base node. The current source $I_2$ is also coupled to the power supply node $V_{cc}$. The anode of diode Q6 and the cathode of Q7 are both connected to the output B and to the collector of transistor Q5. The emitters of transistor Q5 are coupled to the ground node.

The other terminal of the resistor R3 is also coupled to a resistor R4 and to the base of a Schottky NPN transistor Q4. The other terminal of the resistor R4 and the emitter of transistor Q4 are each connected to ground. The collector of transistor Q4 is connected to the cathode of diode Q11, the base of an NPN transistor Q8 and to a conventional current source $I_3$. The current source $I_3$ is also connected to the power supply $V_{cc}$. The collector of transistor Q8 is also connected to the power supply $V_{cc}$.

The anode of diode Q11 is connected to the cathode of diode Q10, a resistor R5, the emitter of transistor Q8 and the base of a large output NPN transistor Q9. The anode of diode Q10 the other terminal of the resistor R5 and the emitters of transistor Q9 are all connected to the output B. The diodes Q10 and Q11 are typically formed of the base-emitter junction of a transistor whose collector is shorted to the base node. The collector of transistor Q9 is connected to the voltage supply $V_{cc}$.

Transistors Q8 and Q9 form a first Darlington circuit 20. A second Darlington circuit 30 is formed from diode Q6, transistors Q2 and Q5. The second Darlington circuit is a composite Darlington. The diode Q7 clamps the diode Q6 to prevent Q6 from being damaged from Zenering during an output low to high transition.

DC OPERATION

When $V_{in}$ is high, both transistors Q1 and Q3 turn on, pulling their collectors low. The current from the current source $I_1$ is shunted through Q1 to the ground. Since the collector of Q1 is pulled low, the transistors Q2 and Q4 both turn off.

With transistor Q4 off, current from current source $I_3$ provides the base drive to the first Darlington circuit 20, pulling the output B high. Once the gate is fully charged, the first Darlington carries only negligible current. Further, because transistor Q3 is on and the base of the transistor Q2 is low, the second Darlington circuit 30 is turned off. The current sources $I_2$ and $I_3$ saturate and provide only negligible current. Notice that the first Darlington circuit 20 is controlled by the transistor Q4.

When $V_{in}$ is low, both transistors Q1 and Q3 are off. With the collectors of the transistors Q1 and Q3 high, the transistors Q2, Q4 and Q5 are all turned on. With the transistor Q4 on, the collector of transistor Q4 is pulled very close to ground turning the first Darlington circuit 20 (transistors Q8 and Q9) off.

The transistor Q2 is the controlling transistor for the composite second Darlington circuit 30. When the transistor Q2 is on and the transistor Q3 is off, the transistor Q5 conducts, discharging the gate of the MOSFET device FET1 and pulling the output node B to the ground. When the output is at its dc low state, the current from the current source $I_3$ flows through the transistor Q4. The current from the current source $I_2$ flows through the diode Q7 and the transistors Q2 and Q5.

The transistor Q1 acts as an inverter to the input $V_{in}$. Accordingly, the transistors Q2 and Q3 are always in an opposite condition from one another, i.e., when the transistor Q3 is on, the transistor Q2 is off and vice-versa.

TRANSIENT OPERATION

The switching threshold $V_{T1}$ for the first Darlington circuit is the potential required at node C to turn on the first Darlington circuit 20. This potential is the base emitter voltage $V_{BE4}$ of the transistor Q4 multiplied by the action of the voltage divider circuit of R3 and R4. The resistance of resistor R3 controls the dead band. As shown in the equation, this resistance is used as a ratio. Because all resistors are simultaneously formed as an though specific impedances may. Thus, $$V_{T1} = V_{BE4}(1 + R_3/R_4)$$

Similarly, the second Darlington circuit has a switching threshold $V_{T2}$ whereby the collector of the transistor Q1 must rise above the base emitter voltage of transistor Q5 plus the base emitter voltage of transistor Q2 plus the diode voltage of diode $D_2$. Thus, $$V_{T2} = V_{BE5} + V_{BE2} + V_{D2}$$

Assuming that the output, node B, is initially high and $V_{in}$ is switched from high to low, the transistor Q1 turns off. Part of the current from the current source $I_1$ charges the parasitic capacitance present at the collector of the transistor Q1. Before node C is charged to $V_{T1}$, Q4 remains off. The remainder of the current flows into R3. When the collector of the transistor Q1 rises to $V_{BE4}(1 + R_3/R_4)$, the transistor Q4 turns on. Since $I_1$ is $V_{BE}$ dependent, $V_{T1}$ and $V_{T2}$ all have similar temperature dependence. The non-conducting time interval is relatively independent of temperature. Once Q4 begins to conduct, the collector voltage of the transistor Q4 falls.

When output node B is high and the collector of Q4 begins to fall the diodes Q10 and Q11 start to conduct, holding the transistors Q8 and Q9 off. The diodes Q10 and Q11 also function as anti-Zenering devices for the transistors Q9 and Q8 by clamping the reverse voltages across the transistor Q8 and Q9 base-emitter junctions to $V_{BE}$.

The gate capacitance of FET1 will only be slightly discharged by the diodes Q10 and Q11 due to limited base drive to the relatively small transistor Q4.

When the collector voltage of transistor Q1 reaches the switching threshold $V_{T2}$ of transistor Q2, the transistor Q5 conducts and discharges the gate capacitance of the MOSFET FET1 to ground. Since the transistors Q8 and Q9 are held in an off condition by transistor Q4 before the transistor Q5 turns on, cross-conduction current due to simultaneous conduction of the transistors Q9 and Q5 is eliminated.

Assuming that the output voltage $V_o$ is initially low and $V_{in}$ is switched from low to high, the transistor Q1 turns on, pulling the collector of transistor Q1 towards ground. Since switching threshold $V_{T2}$ of the transistor Q2 is higher than that of the transistor Q4, the transistor Q2 turns off before the transistor Q4, cutting off base drive to the transistor Q5. Transistor Q4 stays on until the voltage at the collector of the transistor Q1 falls below $V_{BE4}(1 + R_3/R_4)$. As the base drive of the transistor Q4 is removed, the voltage on the collector of transistor Q4 rises. This causes the transistors Q8 and Q9 conduct. The MOSFET gate capacitance is charged towards $V_{cc}$.

The Schottky diode $D_1$ and the transistor Q3 speed up the turn-off transient of the transistors Q2 and Q5, respectively. The resistor R4 shortens the turn-off time of the transistor Q4 by shunting the parasitic base-collector junction capacitance $C_{jc}$ displacement current to ground as the transistor Q4 is switched off. The result is shorter low-to-high propagation delay time $t_{pdHL}$ and faster output rise time $t_r$. Since the base drive of the transistor Q5 is cut off before the collector voltage of the transistor Q4 is allowed to rise, there is again no cross-conduction current during output low-to-high transition.

I claim:

1. An output circuit comprising a totem-pole output circuit with an output node having a high state and a low state having a pull-up circuit having a pull-up threshold voltage and including a voltage clamping circuit coupled to prevent damage to the pull-up circuit during a transition from the high state to the low state and a pull-down circuit having a pull-down threshold voltage and a clamping circuit coupled to prevent damage to the pull-down circuit when the output is in the low state comprising means for preventing the pull-up and pull-down circuits from simultaneously conducting current such that the pull-up circuit is turned off before the pull-down circuit is turned on when the output node switches form a high state to a low state and further wherein the pull-down circuit is turned off before the pull-up circuit is turned on when the output node switches from a low state to a high state; the output circuit further comprising a $V_{BE}$-independent current supply for generating a non-conducting dead time interval relatively independent of temperature.

2. The circuit according to claim 1 wherein the pull-up circuit is turned off before the pull-down circuit is turned on by holding he pull-up circuit off when the output node goes from a high state to a low state by one or more diodes coupled in series from the output node to an input of the pull-up circuit.

3. The circuit according to claim 1 wherein the pull-down threshold is greater than the pull-up threshold so that the pull-down circuit is shut off before the output node is driven from a low state to a high.

4. The circuit according to claim 3 wherein the pull-up circuit has a resistor coupled to shunt the parasitic capacitance current to ground to speed up output low-to-high transition.

5. An output circuit comprising:
   a. an output node having a high state and a low state;
   b. a pull-up circuit coupled to the output node having a pull-up threshold voltage and including a clamping circuit coupled to prevent damage to the pull-up circuit during a transition from the high state to the low state and a resistor coupled to shunt the parasitic capacitance current to ground to speed up output during a low-to-high transition;
   c. a pull-down circuit coupled to the output node having a pull-down threshold voltage and including a clamping circuit coupled to prevent damage to the pull-down circuit when the output is in the low state, wherein the pull-down threshold is greater than the pull-up threshold so that the pull-down circuit is shut off before the output node is driven from a low state to a high state; and
   d. means for preventing the pull-up and pull-down circuits from simultaneously conducting current such that the pull-up circuit is turned off before the pull-down circuit is turned on when the output node switches from a high state to a low state and further wherein the pull-down circuit is turned off before the pull-up circuit is turned on when the output node switches from a low state to a high state.

6. The output circuit as claimed in claim 5 wherein the pull-up circuit is turned off before the pull-down circuit is turned on by holding the pull-up circuit off when the output node goes from a high state to a low state by one or more diodes coupled in series from the output node to an input of the pull-up circuit.

7. A totem-pole output circuit coupled to a power supply, a circuit ground and a field-effect transistor having a gate, a drain, and a source, said drain coupled to a load and said source coupled to the circuit ground, wherein said output circuit comprises:
   a. an output node coupled to the gate of the field effect transistor for controlling said transistor;
   b. a first resistor having a first terminal A and a first terminal B and a second resistor having a second terminal A and a second terminal B, the first terminal A coupled to the second terminal A forming an input node;
   c. a first transistor having a first base, a first emitter and a first collector, the first base coupled to the first terminal B and the first emitter coupled to the circuit ground;
   d. a first current source coupled to the power supply and to the first collector;
   e. a first diode having a first anode and a first cathode and a second diode having a second anode and a second cathode, the first cathode coupled to the second anode, the first collector and the first current source and the first anode coupled to the second cathode;
   f. a second transistor having a second base, a second emitter and a second collector, the second base coupled to the first anode and the second cathode;
   g. a third transistor having a third base, a third emitter and a third collector, the third base coupled to the second terminal B, the third emitter coupled to the circuit ground and the third collector coupled to the second emitter;
   h. a third resistor having a third terminal A and a third terminal B, the third terminal A coupled to the first current source, the first collector, the first cathode and the second anode;
   i. a fourth resistor having a fourth terminal A and a fourth terminal B, the fourth terminal A coupled to the third terminal B and the fourth terminal B coupled to the circuit ground;
   j. a third diode having a third anode and a third cathode and a fourth diode having a fourth anode and a fourth cathode, the fourth anode coupled to the third cathode and to the second collector and the third anode coupled to the fourth cathode;
   k. a second current source coupled to the power supply and to the second collector, the third cathode and the fourth anode;
   l. a third current source coupled to the power supply;
   m. a fourth transistor having a fourth base, a fourth emitter and a fourth collector, the fourth base coupled to the third terminal B and the fourth terminal A, the fourth emitter coupled to the circuit ground and the fourth collector coupled to the third current source;
   n. a fifth transistor having a fifth base, a fifth emitter and a fifth collector, the fifth base coupled to the second emitter and the third collector, the fifth emitter coupled to the circuit ground and the fifth collector coupled to the third anode, the fourth cathode and the output node;
   o. a fifth diode having a fifth anode and a fifth cathode, the fifth anode coupled to the output node;
   p. a sixth diode having a sixth anode and a sixth cathode, the sixth anode coupled to the fifth cathode and the sixth cathode coupled to the third current source and the fourth collector;
   q. a fifth resistor having a fifth terminal A and a fifth terminal B, the fifth terminal A coupled to the fifth cathode and the sixth anode and the fifth terminal B coupled to the fifth anode and the output node;
   r. a sixth transistor having a sixth base, a sixth emitter and a sixth collector, the sixth collector coupled to the power supply, the sixth base coupled to the third current source, the sixth cathode and the fourth collector and the sixth emitter coupled to the fifth terminal A, the fifth cathode and the sixth anode; and
   s. a seventh transistor having a seventh base, a seventh emitter and a seventh collector, the seventh collector coupled to the power supply, the seventh base coupled to the sixth emitter, the fifth terminal A, the fifth cathode and the sixth anode and the seventh emitter coupled to the fifth terminal B, the fifth anode and the output node.

8. The totem-pole output circuit as claimed in claim 7 wherein the first transistor, the second transistor, the third transistor, the fourth transistor and the fifth transistor are all Schottky NPN bipolar transistors.

9. The totem-pole output circuit as claimed in claim 8 wherein the sixth transistor and the seventh transistor are both NPN bipolar transistors.

10. An output circuit comprising a totem-pole output circuit with an output node having a high state and a low state having a pull-up circuit having a pull-up threshold voltage and including a voltage clamping circuit coupled to prevent damage to the pull-up circuit during a transition from the high state to the low state and a pull-down circuit having a pull-down threshold voltage and a voltage clamping circuit coupled to prevent damage to the pull-down circuit when the output is in the low state comprising means for preventing the pull-up and pull-down circuits from simultaneously conducting current such that the pull-up circuit is turned off before the pull-down circuit is turned on when the output node switches from a high state to a low state and further wherein the pull-down circuit is turned off before the pull-up circuit is turned on when the output node switches from a low state to a high state, wherein the pull-down threshold is greater than the pull-up threshold so that the pull-down circuit is shut off before the output node is driven from a low state to a high state and the pull-up circuit has a resistor coupled to shunt the parasitic capacitance current to ground to speed up output low-to-high transition.

11. The circuit according to claim 10 wherein the pull-up circuit is turned off before the pull-down circuit is turned on by holding the pull-up circuit off when the output node goes from a high state to a low state by one or more diodes coupled in series from the output node to an input of the pull-up circuit.

12. The output circuit according to claim 10 further comprising a $V_{BE}$-dependent current supply for generating a non-conducting dead time interval relatively independent of temperature.

13. An output circuit comprising a totem-pole output circuit with an output node having a high state and a low state having a pull-up circuit input node, the pull-up circuit including a first diode and a second diode serially coupled to each other having a first diode anode coupled to the output node and a second diode cathode coupled tot he pull-up circuit input node for preventing damage to the pull-up circuit by clamping the voltage between the output node and the pull-up circuit input node during a transition from the high state to the low state and a pull-down circuit having a pull-down threshold voltage, including a third diode coupled in series with the pull-down circuit having its anode coupled to the output node and its cathode coupled to the pull-down circuit and a fourth diode coupled in a reverse parallel orientation to the third diode for preventing damage to the third diode during a transition from the low state to the high state, the output circuit comprising means for preventing the pull-up and pull-down circuits from simultaneously conducting current such that the pull-up circuit is turned off before the pull-down circuit is turned on when the output node switches from a high state to a low state and further wherein the pull-down circuit is turned off before the pull-up circuit is turned on when the output node switches from a low state to a high state.

14. The circuit according to claim 13 wherein the pull-up circuit is turned off before the pull-down circuit is turned on by holding the pull-up circuit off when the output node goes from a high state to a low state.

15. The circuit according to claim 13 wherein the pull-down threshold is greater than the pull-up threshold so that the pull-down circuit is shut off before the output node is driven from a low state to a high state.

16. The circuit according to claim 15 wherein the pull-up circuit has a resistor coupled to shunt the parasitic capacitance current to ground to speed up output during a low-to-high transition.

17. The output circuit according to claim 13 further comprising a $V_{BE}$-dependent current supply for generating a non-conducting dead time interval relatively independent of temperature.

* * * * *

UNITED STATES PATENT AND TRADEMARK OFFICE
CERTIFICATE OF CORRECTION

PATENT NO. : 5,281,862
DATED : 01/25/94
INVENTOR(S) : BING F. MA

It is certified that error appears in the above-indentified patent and that said Letters Patent is hereby corrected as shown below:

In column 2, line 31, please delete "of".

In column 3, line 47, please add "integrated circuit the ratio does not change even" before --though--.

In column 4, line 62, please replace "form" with --from--.

In column 4, line 66, please replace "$V_{BE}$-independent" with --$V_{BE}$-dependent--.

In column 5, line 3, please replace " he" with --the--.

In column 7, line 39, please insert "having a pull-up threshold voltage, and a pull-up circuit" before --input--.

In column 8, line 3, replace "tot he" with --to the--.

Signed and Sealed this

Second Day of August, 1994

Attest:

BRUCE LEHMAN

Attesting Officer     Commissioner of Patents and Trademarks